(12) United States Patent
Matsuno et al.

(10) Patent No.: US 6,743,301 B2
(45) Date of Patent: Jun. 1, 2004

(54) SUBSTRATE TREATMENT PROCESS AND APPARATUS

(75) Inventors: Kousaku Matsuno, Okayama (JP); Masao Iga, Okayama (JP)

(73) Assignee: m●FSI Ltd., Tokyo (JP)

( * ) Notice: Subject to any disclaimer, the term of this patent is extended or adjusted under 35 U.S.C. 154(b) by 215 days.

(21) Appl. No.: 09/742,423

(22) Filed: Dec. 22, 2000

(65) Prior Publication Data

US 2001/0009155 A1 Jul. 26, 2001

(30) Foreign Application Priority Data

Dec. 24, 1999 (JP) .......................................... 11/367923
Oct. 6, 2000 (JP) ....................................... 2000/307029

(51) Int. Cl.⁷ ................................................ B08B 3/00
(52) U.S. Cl. ................................ 134/26; 134/1; 134/2; 134/3; 134/19; 134/30; 134/32; 134/33
(58) Field of Search ........................ 134/1, 1.3, 2, 19, 134/26, 30, 32, 33, 902, 27, 28, 29; 438/906

(56) References Cited

U.S. PATENT DOCUMENTS

| | | | | |
|---|---|---|---|---|
| 4,812,201 A | * | 3/1989 | Sakai et al. ................. | 156/643 |
| 5,503,708 A | * | 4/1996 | Koizumi et al. ............ | 438/708 |
| 5,739,575 A | * | 4/1998 | Numano et al. ............ | 257/513 |
| 5,783,790 A | * | 7/1998 | Mitsumori et al. ..... | 204/157.15 |
| 5,971,368 A | | 10/1999 | Nelson et al. | |
| 5,983,909 A | * | 11/1999 | Yeol et al. ................. | 134/102.1 |
| 6,035,871 A | * | 3/2000 | Eui-Yeol ...................... | 134/61 |
| 6,039,815 A | * | 3/2000 | Yeol et al. ...................... | 134/2 |
| 6,080,531 A | | 6/2000 | Carter et al. | |
| 6,086,057 A | * | 7/2000 | Mitsumori et al. ....... | 261/122.1 |
| 6,217,665 B1 | * | 4/2001 | Suzuki .......................... | 134/1 |
| 6,290,777 B1 | * | 9/2001 | Imaoka et al. ................. | 134/1 |
| 6,325,359 B1 | * | 12/2001 | Haga et al. ..................... | 261/42 |
| 2002/0088478 A1 | * | 7/2002 | Degendt et al. ................ | 134/3 |

FOREIGN PATENT DOCUMENTS

| | | | |
|---|---|---|---|
| JP | 63271938 | * | 11/1988 |
| JP | 08078372 | * | 3/1996 |

OTHER PUBLICATIONS

Werner Kern. Handbook of Semiconductor Cleaning Technology, 1993, Noyes Publications, p. 120.*

* cited by examiner

*Primary Examiner*—M. Kornakov
(74) *Attorney, Agent, or Firm*—Oblon, Spivak, McClelland, Maier & Neustadt, P.C.

(57) ABSTRACT

A substrate treatment process is disclosed to remove organic matter existing on a substrate such as a wafer, glass substrate or ceramic. The process comprises treating the substrate with ozone water and then with hydrogen water, or treating the substrate with ozone-hydrogen water or treating the substrate with ozone water and hydrogen water at the same time.

19 Claims, 3 Drawing Sheets

SUBSTRATE TREATMENT PROCESS AND APPARATUS

BACKGROUND OF THE INVENTION a) Field of the Invention

This invention relates to a process and apparatus for treating a variety of substrates—such as wafers, glass substrates or ceramic substrates for forming semiconductor devices thereon (hereinafter called "substrates")—by cleaning off, subsequent to formation of a fine arrangement of electrical component parts or a circuit (hereinafter may be commonly called "pattern") on the substrates, foreign matter such as organic matter remaining on the substrates and other foreign matter adhered during or after the formation of the pattern.

The term "ozone water" as used herein means water which is available by dissolving an ozone-containing gas in ultrapure water. The term "hydrogen water" as used herein means water which is available by dissolving a hydrogen-containing gas in ultrapure water. Further, the term "ozone-hydrogen water" as used herein means water which is available by dissolving an ozone-containing gas and a hydrogen-containing gas in ultrapure water or by mixing ozone water and hydrogen water.

b) Description of the Related Art

When forming a pattern on a substrate, an organic material such as a photoresist (hereinafter called a "resist") is coated on the substrate, exposed and then developed to form a desired resist pattern, and the substrate is thereafter subjected to treatment such as etching at a surface thereof. Subsequent to this treatment, any unnecessary resist on the substrate is removed.

After the removal of the resist, it is necessary to clean off very small pieces of the resist, said pieces still remaining on the substrate, and other foreign matter adhered during or subsequent to the formation of the pattern. Conventional cleaning processes for this purpose are classified into wet processes or dry processes depending on the kinds and properties of the resists and the forming steps of component parts.

In the wet processes, a chemical solution which contains sulfuric acid, hydrogen peroxide or the like as a principal component and has oxidizing power is used in many instances (SPM treatment). In the dry processes, on the other hand, organic matter or the like on a substrate is removed by ashing the same while using oxygen as a primary process gas. Depending on the state of contamination of a substrate, cleaning treatment is also performed making appropriately combined use of ashing treatment with oxygen plasma, SPM treatment, and treatment with a chemical solution containing ammonia and hydrogen peroxide or the like as principal components (APM treatment).

As illustrative conventional techniques for such treatment of substrates, JP 10-298589 A discloses a process in which subsequent to plasma ashing of a resist, organic matter and the like on a substrate are removed using ozone water with a basic fluoride added therein. A process is proposed in JP 9-255998 A, in which ultraviolet rays are irradiated in the presence of ozone gas to remove fine organic particles which are remaining on a substrate. JP 10-41262 A discloses to use carbonated water or hydrogen water, which has been prepared by dissolving hydrogen gas in ultrapure water, for the removal of fine metal particles while minimizing corrosion of a pattern such as metalization, i.e., a deposited film pattern of a conductor material. Further, it is proposed in JP 10-128253 A to clean and rinse a substrate under exposure to supersonic waves in hydrogen water which has been prepared by dissolving hydrogen gas to a concentration of 0.05 ppm or higher in ultrapure water.

The cleaning with ozone water subsequent to ashing as disclosed in JP 10-298589 A involves a potential problem in that a substrate may be damaged as the plasma ashing is performed with high energy, and the cleaning treatment with the ozone water is accompanied by a further potential problem in that the damage may be deteriorated. In addition, surface roughening may also occur by a cause other than the plasma ashing, and the cleaning with the ozone water has a potential problem in that damage may be spread from such surface roughening. The process disclosed in JP 9-255998 A, in which ultraviolet rays are irradiated in the presence of ozone, is intended for fine organic particles, and cannot be applied for stripping a resist. The cleaning with ozone water, which is disclosed in JP 10-41262 A, is intended to remove fine metal particles, and the effect of the ozone water depends upon the concentration of ozone contained in the ozone water. The concentration of ozone in conventional ozone water, which is available at room temperature under the surrounding atmospheric pressure, is its saturated concentration at the maximum, and therefore, this cleaning process is not considered to be effective for the removal of organic matter still remaining after dry ashing of a resist. Further, the process disclosed in JP 10-128253 A, in which a substrate is soaked in hydrogen water prepared by dissolving hydrogen gas to a concentration of 0.05 ppm or higher in ultrapure water and is exposed to ultrasonic waves, relates to rinsing treatment, and this patent publication makes no mention about the removal of a residue of a resist after dry ashing of the resist.

Of these conventional processes, the wet processes use one or more chemicals such as sulfuric acid, hydrogen peroxide and/or ammonia upon treatment, and may develop one or more defects in a formed pattern due to formation of sulfuric acid vapor, which gives detrimental effects such as corrosion to a substrate, or due to incorporation of a metal component such as iron due to the use of ammonia. Avoidance of these problems leads to a further problem that subsequent to the treatment, a great deal of cleaning water is needed, resulting in a substantial load of effluent on the environment. On the other hand, the use of oxygen plasma in the dry processes involves a problem in that a substrate, which is chemically sensitive, and a pattern formed on the substrate may be damaged because the plasma has high energy.

SUMMARY OF THE INVENTION

An object of the present invention is, therefore, to provide a substrate treatment process and apparatus, which can achieve similar cleaning effects as the conventional techniques without needing use of sulfuric acid, hydrogen peroxide, ammonia, oxygen plasma and/or the like as an essential requirement and without causing production of harmful vapor, incorporation of a metal component such as iron, damage to a substrate, a pollutant load on the environment, or the like.

The above-described object can be achieved by the present invention. In one aspect of the present invention, there is thus provided a substrate treatment process for removing organic matter existing on a substrate, which comprises the following consecutive steps:

treating said substrate with ozone water which has been prepared by dissolving an ozone-containing gas in ultrapure water; and treating said substrate with hydrogen water which has been prepared by dissolving a hydrogen-containing gas in ultrapure water.

In another aspect of the present invention, there is also provided a substrate treatment process for removing organic matter existing on a substrate, which comprises the following step:

treating said substrate with ozone-hydrogen water, which has been prepared by dissolving an ozone-containing gas and a hydrogen-containing gas in ultrapure water, or with ozone-hydrogen water prepared by mixing ozone water, which was in turn prepared by dissolving an ozone-containing gas in ultrapure water, and hydrogen water which was in turn prepared by dissolving a hydrogen-containing gas in ultrapure water; or treating said substrate with said ozone water and said hydrogen water at the same time.

In a further aspect of the present invention, there is also provided a substrate treatment apparatus for a substrate, comprising:

a treatment vessel, a substrate holder for rotating said substrate in a horizontal plane in said treatment vessel, a nozzle unit arranged in an upper part of said treatment vessel such that a liquid is downwardly fed, a feed line for feeding the liquid to said nozzle unit, and a chamber enclosing therein said apparatus in its entirety;

wherein said nozzle unit is constructed in a form of a bar such that as viewed in plan, the liquid ejected from said nozzle unit reaches, with an area range having a length not smaller than a diameter of said substrate and a width smaller than said diameter of said substrate, said substrate. The substrate treatment apparatus is suited for practicing the substrate treatment processes.

The processes according to the present invention use only ozone and hydrogen waters or ozone-hydrogen water to remove unnecessary resist after formation of an arrangement of electrical component parts or a circuit, that is, a pattern on a substrate, and therefore, are low-cost processes which give neither substantial pollutant load on the environment nor damage to the pattern. The processes of the present invention are expected to minimize corrosion-related reductions in electrical characteristics of a device and hence to bring about improvements in production yield, so that they make it possible to lower the running cost of a semiconductor fabrication system and also to improve the safety. As is appreciated from the foregoing, the series of treatments in the cleaning step subsequent to the stripping of a resist, said treatments making use of ozone and hydrogen waters or ozone-hydrogen water, can solve various problems in future manufacturing business, such as energy conservation, owing to a reduction in the pollutant load on the environment and simplification of the device forming steps.

Fine particles existing on a substrate, such as pieces of a resist, have heretofore been removed using sulfuric acid, ammonia, hydrogen peroxide, organic solvent or the like. As the processes of the present invention do not use these chemical solutions, they do not significantly corrode the arrangement of component parts or the interconnecting conductive material. Damage to the arrangement of the component parts or the circuits is thus reduced, leading to improvements, for example, in the reliability of performance of the device. This can obviate a step for the prevention of corrosion or, even if such a step is still needed, the cost of materials employed for such treatments can be reduced. On the other hand, the reduction in the corrosion to the interconnecting conductive material leads a reduction in the electrical resistance of the device, a reduction in the power consumption by the device, and a higher speed in the performance of the device.

The conventional treatment in which hydrogen water is used in an activated form is said to permits removal of very fine particles. The processes of the present invention have a significance in that owing to the above-described combination of the treatment with ozone water and the treatment with hydrogen water or the above-described use of ozone-hydrogen water, steps ranging, for example, from the stripping of a resist or the like to the subsequent cleaning can be conducted together without using a conventional chemical solution of high purity such as sulfuric acid. Use of the processes and apparatus according to the present invention, which have enabled it, has made it possible for the first time to perform the treatment.

According to the present invention, the resist stripping step and the cleaning step can be conducted together. This has made it unnecessary to carry each substrate from one processing step to another, thereby brining about merits such as a reduction in the risk to contact a dangerous chemical solution and a reduction in the risk to contact a pollutant. Owing to these merits, the single-step treatment can contribute to a reduction in cost.

DETAILED DESCRIPTION OF THE INVENTION AND PREFERRED EMBODIMENTS

Figure 1:
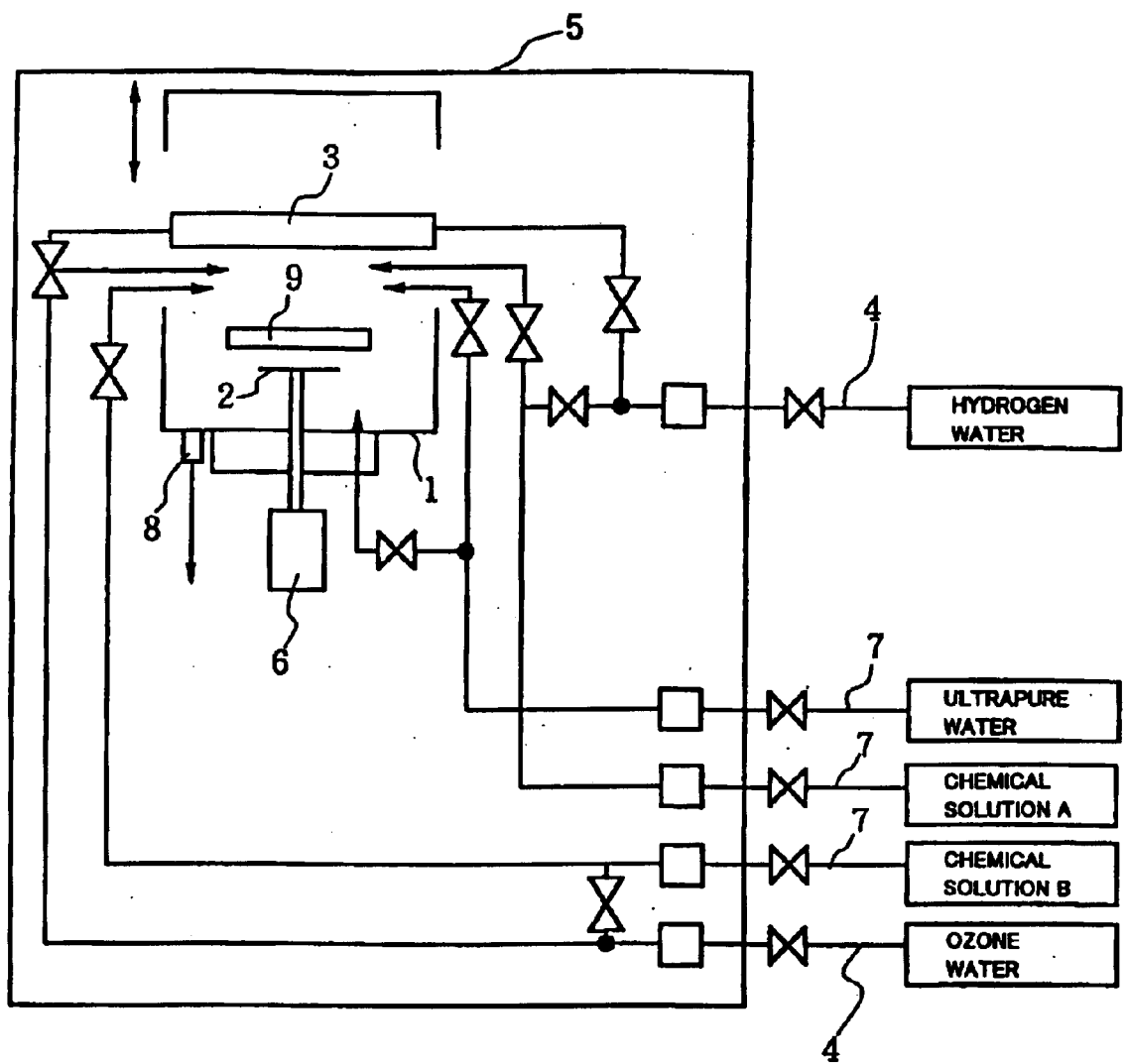
FIG. 1 is a simplified block diagram of a treatment apparatus according to the present invention.

The present invention will next be described in further detail based on certain preferred embodiments.

Examples of the substrate to be treated by the processes of the present invention can include glass substrates and a variety of substrates composed of silicon or metal compound crystals, and no particular limitation is imposed thereon. Nonetheless, the present invention is applied primarily to substrates each of which has been treated through a resist stripping step subsequent to formation of a pattern thereon with an organic substance such as a resist.

Described specifically, a pattern is formed with a resist on a substrate by imagewise exposure, development, baking, etching, resist stripping and the like. Upon resist stripping, however, the resist is not fully removed from the substrate, but in many instances, very small pieces of the resist may remain on the substrate, once-stripped very small pieces of the resist may adhere back onto the substrate, or very fine pieces of foreign matter other than resist pieces, such as those of various organic substances, may adhere onto the substrate in the above-described steps. The present invention is useful especially for cleaning such substrates. Resist pieces (i.e., pieces of a resist still remaining after stripping the resist) and very fine foreign matter composed of other organic substances will hereinafter be collectively called "resist pieces" or "very fine particles".

When a number of ions are implanted in a resist in a pattern forming step, for example, when $1 \times 10^{15}$ ions are implanted per $cm^2$, it has been a conventional practice to remove resist pieces by oxygen plasma or the like in the above-described dry process. When the ion implantation level is $1 \times 10^{13}$ ions or so, the processes of the present invention can also sufficiently remove resist pieces. The processes of the present invention are, therefore, useful especially for the removal of resist pieces when the ion implantation level is $1 \times 10^{13}$ ions or less in a fabrication process of a semiconductor device such as LSI.

In an embodiment of the present invention, it is still possible to remove and clean off resist pieces without development of problems of the conventional art even when $1 \times 10^{15}$ or more ions are implanted per $cm^2$ in a resist, provided that dry treatment is conducted with ozone gas as pretreatment of a cleaning step. About this embodiment, a detailed description will be made subsequently herein.

Ozone water for use in the present invention is available by dissolving an ozone-containing gas in ultrapure water, the concentration of ozone in ozone water may preferably be 10 ppm or higher, with 50 to 100 ppm being more preferred. An ozone concentration lower than 10 ppm may require substantial time for the oxidative decomposition of resist pieces adhered on a substrate. The higher the ozone concentration, the more preferred, and the ozone concentration may exceed 100 ppm. Such ozone water can be readily obtained by bringing an ozone-containing gas, which has been produced from a known ozone generator, into contact with ultrapure water. The ozone water may contain, in addition to ozone, carbon dioxide, ammonium carbonate, acetic acid, formic acid or the like to maintain the ozone concentration.

The ozone water can be applied to a substrate at a rate of 1 mL/min or higher, preferably from 1 to 10 mL/min per $cm^2$ of substrate area. An application rate lower than 1 mL/min involves a potential problem in that the ozone water may not spread over the entire surface of the substrate and the oxidative decomposition of resist pieces adhered on the substrate may not be achieved sufficiently. At 1 mL/min or higher, a film of the ozone water is formed over the entire surface of the substrate so that resist pieces are fully decomposed through oxidation. An application rate higher than 10 mL/min, on the other hand, cannot bring about any particular additional advantage but conversely, results in higher cost.

When ozone water is applied to a substrate as described above, resist pieces adhered on the substrate are oxidatively decomposed, and the resist pieces so oxidized are promptly cleaned off by the subsequent treatment with hydrogen water. When organic matter such as resist pieces is remaining in a large amount or ions have been implanted at a high level in a resist, the above-described treatment with ozone water may be conducted twice or more consecutively.

Upon treatment with ozone water, the substrate or its treatment atmosphere may be heated to promote the oxidative decomposition with the ozone water. The substrate or its treatment atmosphere may be heated to 30° C. or higher, preferably to 60° C. or higher. Such heating can be effected in any suitable manner, for example, by introducing heated ultrapure water or heated nitrogen gas into a treatment system.

Hydrogen water for use in the present invention can be obtained by bringing a hydrogen-containing gas, which has been produced by a known hydrogen generator, into contact with ultrapure water. The concentration of hydrogen in the hydrogen water may preferably be 0.5 ppm or higher, with 1.0 to 1.6 ppm being particularly preferred. A hydrogen concentration lower than 0.5 ppm may require too much time in some instances for the sufficient removal of resist pieces. A hydrogen concentration higher than 1.6 ppm, on the other hand, may be dangerous pressure in some instances due to release of hydrogen gas under atmospheric. Further, such a high hydrogen concentration is not preferred because bubbles are formed and cause a substantial reduction in the efficiency of cleaning.

The hydrogen water can be applied to a substrate at a rate of 1 mL/min or higher, preferably from 1 to 10 mL/min per $cm^2$ of substrate area. An application rate lower than 1 mL/min involves a potential problem in that the hydrogen water may not spread over the entire surface of the substrate and the cleaning effect for an ozone-oxidized residue of resist pieces, said residue being adhered on the substrate, may not be exhibited sufficiently. At 1 mL/min or higher, a film of the hydrogen water is formed over the entire surface of the substrate so that the ozone-oxidized residue is fully cleaned off. An application rate higher than 10 mL/min, on the other hand, cannot bring about any particular additional advantage but conversely, results in higher cost.

The treatments with ozone water and the treatment with hydrogen water may each be repeated a plurality of times depending on the extent of contamination of a substrate. Concerning the order of the treatment with ozone and that with hydrogen order, it is preferred to firstly conduct the treatment with ozone water, followed by the treatment with hydrogen water. These treatments may, however, be conducted in an opposite order. Further, the treatment with ozone water and the treatment with hydrogen water may be alternately repeated.

In the present invention, it is also possible to simultaneously conduct the treatment with ozone water and the treatment with hydrogen water. As a further alternative, a substrate may also be treated with ozone-hydrogen water which is available by mixing the ozone water and the hydrogen water at an appropriate ratio. As a still further alternative, a substrate may also be treated with ozone-hydrogen water which is available by dissolving an ozone-containing gas and a hydrogen-containing gas in ultrapure water. Further, treatment with ozone water or hydrogen water may be added before and after the treatment with the ozone-hydrogen water. Whichever treatment is applied, the concentration of ozone or hydrogen in the ozone water, hydrogen water or zone-hydrogen water, the application rate of such water to the substrate and the heating of the substrate may be as described above.

By treating a substrate with ozone water and hydrogen water or with ozone-hydrogen water as described above, resist particles adhered on the substrate are promptly cleaned off. Especially upon treatment with hydrogen water or upon treatment with ozone-hydrogen water, the cleaning effect for the substrate can be further enhanced by applying supersonic waves to the hydrogen water or ozone-hydrogen water and activating hydrogen. The ultrasonic treatment may be conducted in a conventional manner, and no particular limitation is imposed thereon. However, the frequency of ultrasonic waves may be 0.5 MHz or higher, preferably 1 MHz or higher. Incidentally, ultrasonic waves may be applied to the ozone water without any problem or inconvenience.

The above-described treatment of the substrate with ozone water, hydrogen water or ozone-hydrogen water can preferably be conducted while rotating the substrate in a horizontal plane, and the rotational speed of the substrate may be 500 rpm or higher, preferably from 1,000 to 3,000 rpm. A rotational speed of the substrate, which is lower than 500 rpm, is insufficient in the replacement of the used portion of the treatment solution by a fresh supply of the treatment solution on the substrate under centrifugal force and also in the spinning-out of removed resist pieces. A rotational speed higher than 3,000 rpm, on the other hand, is not preferred because the substrate is spin-dried and a film of the treatment solution can be hardly formed on the substrate as needed.

The above-described treatment of the substrate with ozone water, hydrogen water or ozone-hydrogen water is performed preferably in an atmosphere sealed as a whole and isolated from the outside, because ozone is a toxic gas and intrusion of dust or the like from the outside should be avoided. After completion of the cleaning treatment, ozone which is still remaining in a treatment region can be readily rendered harmless by thermal decomposition or UV decomposition.

A description will next be made about the treatment apparatus according to the present invention. The treatment apparatus for practicing the above-described processes of the present invention is characterized in that, as is illustrated in FIG. 1, it has a treatment vessel 1, a substrate holder 2 arranged for rotation in a horizontal plane within the treatment vessel, a nozzle unit 3 arranged in an upper part of the treatment vessel for ejecting liquids downwardly, feed lines 4 for feeding the liquids to the nozzle unit, and a chamber 5 enclosing the apparatus in its entirety and also in that the nozzle unit 3 is in the form of a bar having a length not smaller than the diameter of a substrate 9 and a width narrower than the diameter of the substrate. In addition, the treatment apparatus is also provided with a motor 6 for rotating the substrate holder 2, feed lines 7 for feeding other chemicals as needed, for example, ultrapure water, an acid such as hydrochloric acid, sulfuric acid or hydrofluoric acid, an alkaline solution such as aqueous ammonia, carbon dioxide gas, nitrogen gas, and/or a carboxylic acid compound, and a drain 8 for discharging liquid accumulated in the treatment vessel 1.

In the apparatus depicted in FIG. 1, one or more substrates 9 (hereinafter referred to as "the substrate" for the sake of simplification of the description) are mounted on the substrate holder 2 by a suitable means, for example, a chuck system such as a vacuum chuck or a side support system. As was described above, subsequent to pretreatment of the substrate as needed, ozone and hydrogen waters or ozone-hydrogen water is applied in a series of steps onto the substrate rotating in a horizontal plane such that the substrate is cleaned. After the substrate has been cleaned, the substrate is rinsed with ultrapure water as needed, and the rotational speed of the substrate holder 2 is then increased to dry off by the so-called spin dry method the liquid adhered on the substrate. The substrate is therefore obtained in a cleaned form.

When it is desired to treat the substrate with ozone-hydrogen water, ozone-hydrogen water is prepared beforehand by mixing the ozone water and the hydrogen water at a predetermined ratio or dissolving an ozone-containing gas and a hydrogen-containing gas at predetermined concentrations in ultrapure water, and the ozone-hydrogen water is fed to the nozzle unit 3 through one of the lines shown in the drawing and is then ejected from the nozzle unit 3. When it is desired to simultaneously treat the substrate with ozone water and hydrogen water, on the other hand, ozone water and hydrogen water are fed to the nozzle unit 3 while controlling their feed rates at a predetermined ratio, and are then ejected against the substrate 9 at the same time.

Figure 2A:
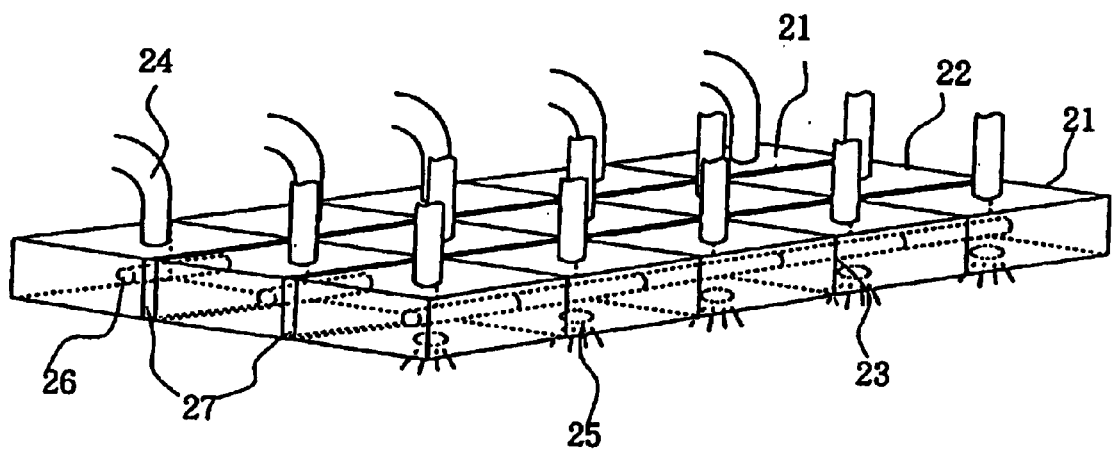
FIG. 2A is a perspective schematic view of a nozzle unit employed in the treatment apparatus of FIG. 1.
Figure 2B:
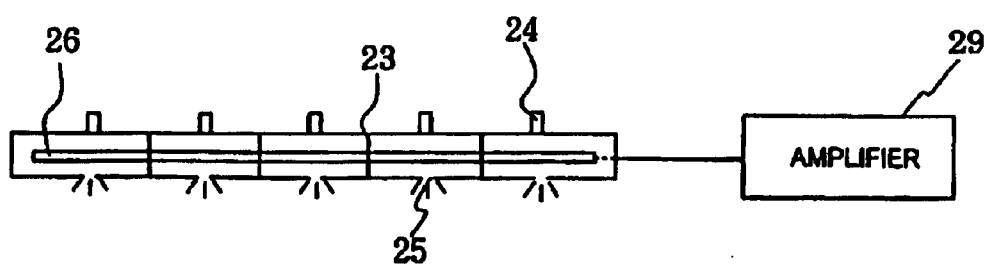
FIG. 2B is a side view of the nozzle unit of FIG. 2A, in which a side wall has been removed to show the internal construction of the nozzle unit and an amplifier connected via an output line to quartz rods as ultrasonic generators is also shown as a block.
Figure 2C:
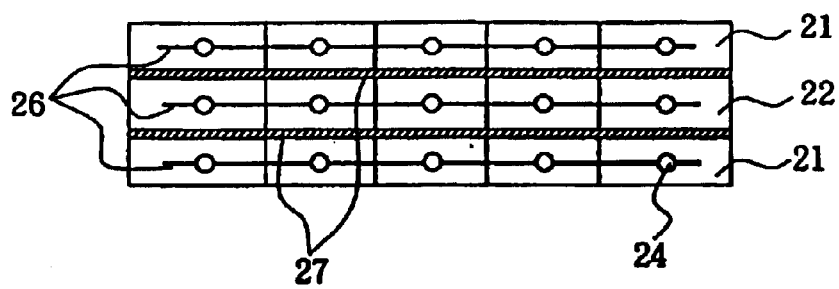
FIG. 2C is a top plan view of the nozzle unit of FIGS. 2A and 2B, in which a top wall has been removed to show the internal construction of the nozzle unit.

In the above-described apparatus according to the present invention, characteristic features are found especially in the construction of the nozzle unit 3. One example of the nozzle unit is shown in FIGS. 2A, 2B and 2C. The nozzle unit has a length substantially equal to or greater than the diameter of the substrate and a width narrower than the diameter of the substrate, so that the nozzle unit is constructed in the form of a bar. It is, however, not absolutely necessary to dimension the nozzle unit exactly as specified above. The nozzle unit may be constructed in the form of a bar such that as viewed in plan, the liquid ejected from the nozzle unit reaches, with an area range having a length not smaller than a diameter of the substrate and a width smaller than the diameter of the substrate, the substrate. Inside the nozzle unit, cells 21,22 are formed by lateral partitions 23 and longitudinal partitions 27. In the illustrated embodiment, ozone water or ozone-hydrogen water is fed to the cells 21 while hydrogen water or ozone-hydrogen water is feed to the cells 22. The individual cells are provided with tubes 24 through which the fluids are fed, respectively. The cells are also provided in bottom walls thereof with outlets 25 to eject the respective liquids there through. Ozone water, hydrogen water or ozone-hydrogen water can be evenly ejected by dividing a flow passage for ozone water, hydrogen water or ozone-hydrogen water into many cells, feeding ozone water, hydrogen water or ozone-hydrogen water to the individual cells and then ejecting the ozone water, hydrogen water or ozone-hydrogen water through the respective outlets. Preferably, these outlets may be spray nozzles.

The individual cells 21, through which ozone water or ozone-hydrogen water is ejected, and the individual cells 22, through which hydrogen water or ozone-hydrogen water is ejected, are provided with quartz rods 26 which are ultrasonic wave generators and longitudinally extend through the corresponding cells, so that ultrasonic waves are applied to ozone water, hydrogen water or ozone-hydrogen water. For hydrogen water and ozone-hydrogen water, application of ultrasonic waves is desired. For ozone water, on the other hand, application of ultrasonic waves is not essential. It is, therefore, unnecessary to provide the cells for ozone water with the quartz rods 26. An amplifier 29 is connected via an output line to the quartz rods 26, so that the quartz rods 26 are oscillated to generate ultrasonic waves.

To be ready for such use that only hydrogen water or ozone-hydrogen water is treated with ultrasonic waves and ozone water is not treated with ultrasonic waves, it is preferred to arrange as the longitudinal partitions 27 buffer plates, which have function to shield ultrasonic waves, between the cells 21 for ozone water and the cells 22 for hydrogen water or ozone-hydrogen water. By feeding ozone water, hydrogen water or ozone-hydrogen water onto the surface of the substrate by using the nozzle unit of the construction as described above, the ozone water, hydrogen water or ozone-hydrogen water is evenly spread onto the surface of the substrate because the substrate itself is being rotated at a high speed. The substrate is, therefore, evenly cleaned.

Although not essential in the present invention, the effects of the present invention can be further enhanced by subjecting organic matter—which is adhered on the substrate—to ashing with an oxidizing gas such as an ozone-containing gas (hereinafter called "ozone gas") or oxygen gas before any one of the steps, in which the substrate is treated with ozone water, hydrogen water and ozone-hydrogen water, respectively, washing the substrate with an organic solvent before the step, or treating the substrate with hydrogen-fluoride-containing water after the step as needed.

Especially when ions are implanted in a resist at a dose of $1\times10^{15}$ or more per $cm^2$, use of ozone gas is preferred for the above-described ashing. It is preferred to conduct the ozone gas treatment at least once in a dry atmosphere while directly or indirectly heating the substrate to room temperature or higher. Upon conducting the ozone gas treatment, the temperature may preferably range from 300 to 350° C. At a temperature lower than 300° C., ashing is not allowed to proceed to sufficient extent. At a temperature higher than 350° C., there is a potential problem that the substrate and/or the pattern may be damaged. Further, the concentration of ozone in the ozone gas may preferably be 4 vol. % or higher. An ozone concentration lower than 4 vol. % may not allow the ashing to proceed to sufficient extent. Such ozone gas treatment may be conducted once or a plurality of times depending on the conditions of the substrate.

Different from the conventional oxygen plasma treatment, the ozone gas treatment can oxidatively decompose resist pieces without giving damage to the substrate or the construction formed on the substrate. It is particularly effective for the ashing of resist pieces, because different from the conventional dry ozone treatment, the temperature of the substrate surface is heated to about 300° C. and an ozone gas having a higher ozone concentration compared with the conventional art is employed. Further, no plasma is used. It is therefore possible to conduct the ashing of resist pieces at atmospheric pressure without needing producing a vacuum within the treatment chamber.

Figure 3:
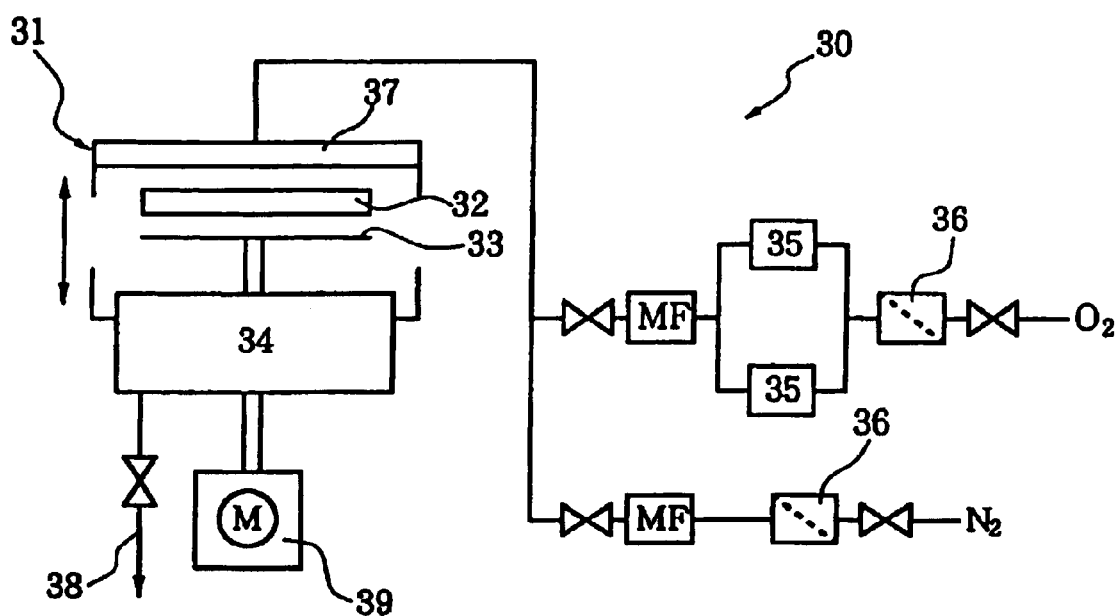
FIG. 3 is a simplified block diagram of an illustrative apparatus for use upon subjecting organic matter to ashing with an ozone-containing gas before treating a substrate with ozone water, hydrogen water or ozone-hydrogen water in a substrate treatment process according to a preferred embodiment of the present invention.

For the ozone gas treatment in the present invention, a single-wafer ashing apparatus such as that illustrated in FIG. 3 can be used, for example. In FIG. 3, a chamber 31 of an ashing apparatus 30 is designed such that it can be automatically opened or closed. The chamber is internally provided with a quartz-made susceptor 33 equipped with a mechanism for holding a substrate 32 at three points. In association with opening and closing of the chamber, the substrate can be carried into the chamber and held in place on the quartz-made susceptor 33, respectively. The chamber 31 is hermetically closed before ashing with ozone gas, and the substrate 32 is heated from the back side thereof by a heater 34 via the susceptor 33. On the other hand, ozone gas can be obtained from an oxygen-containing gas such as air or oxygen by a silent-discharge or electrolytic ozone generator, and can be used. In FIG. 3, the ashing apparatus 30 is provided with a silent-discharge ozone generators 35 by way of example. An oxygen-containing gas is fed into the silent-discharge ozone generators 35 through a filter 36. The silent-discharge ozone generators 35 produce an ozone gas containing ozone at a concentration of 4 vol. % or higher, which is then introduced into a diffuser 37 disposed in the chamber 31. By the diffuser 37, the ozone gas is caused to efficiently diffuse in the chamber 31. After ozone ashing, nitrogen gas is introduced into the chamber 31 through a filter 36 in much the same way as the oxygen-containing gas to promptly replace and purge ozone in the treatment atmosphere. To avoid release of the ozone gas into the atmosphere, the purged exhaust gas is fed to an ozone ashing apparatus (not shown) through an exhaust line and the ozone gas is discharged as oxygen out of the apparatus. Incidentally, the ozone gas from the ozone generators 35 and the purging nitrogen gas from the filter 36 are controlled in flow rate by flow rate (mass) control devices (MF) arranged on the respective feed lines, and are then fed into the chamber 31. Further, a spin motor 39 is arranged below the chamber 31 to rotate the susceptor 33 so that the substrate mounted on the susceptor is rotated. Treatment with the ozone gas is performed in this manner.

The present invention will next be described more specifically based on Examples and Comparative Example. It should however be borne in mind that the following Examples and Comparative Example are merely illustrative and shall by no means limit the present invention. It should also be understood that appropriate treatment conditions vary depending upon the amount of resist pieces adhered on a substrate and also that the removal of resist pieces is not a sole object of the present invention. It will be understood from the following Examples that in the processes of the present invention, effects can be expected for the complete removal of foreign matter from substrates contaminated with resist pieces and other organic substances.

As substrates treated by the processes of the present invention have high surface cleanliness, it is implied that the substrates permit formation of patterns with improved characteristics.

In the following description, the term "SPM (treatment)" will mean treatment with a mixture of sulfuric acid (concentration: 96 wt. %) and hydrogen peroxide (concentration: 30 wt. %) and the term "APM (treatment)" will mean treatment with a mixture of aqueous ammonia (concentration: 28 wt. %) and hydrogen peroxide (concentration: 30 wt. %). These treatment solutions were used after diluting them with ultrapure water as needed.

In the following Examples, Sample A, Sample B, Sample C, Sample D and Sample E were prepared as will be described hereinafter.

Each 8-inch Si wafer (hereinafter called "substrate") formed by CZ process was ultrasonically treated with the APM treatment solution (ammonia:hydrogen peroxide:ultrapure water=1:1:8) at 70° C. in a wet-soak cleaning equipment. After the substrate so treated was dried, a resist sensitive to i beam (wavelength: 365 nm) was coated on the substrate by a single-wafer spin coater. The substrate was exposed to i beam over the entire coated surface thereof to polymerize the resist, followed by baking. After that, $BF_2^+$ or $As^+$ ions were implanted. One implanted with $BF_2$ at a dose of $5.0\times10^{13}$ atoms/$cm^2$ (acceleration voltage: 15 KeV) was provided as Sample A, one implanted with As at a dose of $8.0\times10^{13}$ atoms/$cm^2$ (acceleration voltage: 30 KeV) was provided as Sample B, and one not subjected to implantation was provided as Sample C.

Additional samples were prepared in a similar manner as described above except that the coat amount of the resist and the dose of $BF_2$ or Sr were changed. One implanted with $BF_2$ at a dose of $3.0\times10^{15}$ atoms/$cm^2$ (acceleration voltage: 20 KeV) was provided as Sample D, and one implanted with As at a dose of $2.0\times10^{15}$ atoms/$cm^2$ (acceleration voltage: 40 KeV) was provided as Sample E.

The resist thickness of each sample was measured by an interference film-thickness measuring instrument. Preparation conditions for Samples A–E are summarized in Table 1.

TABLE 1

Preparation Conditions for Samples

| Sample | A | B | C | D | E |
|---|---|---|---|---|---|
| Used substrate | 8' Si wafer | 8' Si wafer | 8' Si wafer | 8' Si wafer | 8' Si wafer |
| Resist film thickness | About 7000 Å | About 7000 Å | About 7000 Å | About 12000 Å | About 12000 Å |
| Exposing conditions | Entire surface exposure to i beam for 25 seconds | Entire surface exposure to i beam for 25 seconds | Entire surface exposure to i beam for 25 seconds | Entire surface exposure to i beam for 25 seconds | Entire surface exposure to i beam for 25 seconds |
| Baking conditions | 120° C., 5 sec in $N_2$ stream | 120° C., 5 sec in $N_2$ stream | 120° C., 5 sec in $N_2$ stream | 120° C., 5 sec in $N_2$ stream | 120° C., 5 sec in $N_2$ stream |
| Implanted ion species | $BF_2^+$ | $As^+$ | — | $BF_3^+$ | $As^+$ |
| Dose | $5.0 \times 10^{13}$ atoms/cm$^2$ | $8.0 \times 10^{13}$ atoms/cm$^2$ | — | $3.0 \times 10^{15}$ atoms/cm$^2$ | $2.0 \times 10^{15}$ atoms/cm$^2$ |
| Implanting conditions | 15 KeV | 30 KeV | — | 20 KeV | 40 KeV |

Examples of the present invention and Comparative Example, in which Samples A, B, C, D and E were used, will be described hereinafter. Treatment steps of the respective Examples and Comparative Example are shown in Table 2.

In Examples 1–3 and Comparative Example 1, processing or treatment, which ranged from resist stripping to drying via cleaning, of Samples A–C were all conducted successively by using the equipment shown in FIG. 1, namely, in the same treatment chamber of the same equipment. In Example 4, ashing of the resist was conducted as a pretreatment in the equipment depicted in FIG. 3, and subsequently, cleaning was conducted by the apparatus shown in FIG. 1 in a similar manner as in Example 1–3.

EXAMPLE 1

Striping Treatment of Resist with Ozone Water

The ozone water for treating each sample was ejected from the nozzle unit shown in FIGS. 2A–2C. Treatment conditions for that treatment step are shown in Table 3. In addition, the thickness values of the resist film before and after the treatment are also shown. The ejection rate of ozone water at that time was 10 mL/min per cm$^2$ of substrate area. Through the outlets other than the outlets for the ozone water, ultrapure water which had been heated to 50° C. by a quartz heater was ejected onto each substrate. Over the ultrapure water, ozone water was ejected at the same ejection rate as that described above.

TABLE 2

Details of Sample Treatment

| Example | Resist stripping method | Cleaning 1 after stripping | Cleaning 2 after stripping |
|---|---|---|---|
| Example 1 | Ozone water (60 ppm) | Ozone water (60 ppm) | Hydrogen water (1.5 ppm) |
| Example 2 | SPM | Ozone water (60 ppm) | Hydrogen water (1.5 ppm) |
| Example 3 | SPM | None | Ozone water (60 ppm) + Hydrogen water (1.5 ppm) |
| Example 4 | Ashing of resist with ozone gas | Ozone water (60 ppm) | Hydrogen water (1.5 ppm) |
| Comp. Ex. 1 | SPM | None | APM |

TABLE 3

Conditions for Resist Stripping with Ozone Water (60 ppm), and Results of Stripping

| Sample | A | B | C |
|---|---|---|---|
| Treatment solution | Ozone water | Ozone water | Ozone water |
| Ozone concentration | 60 ppm | 60 ppm | 60 ppm |
| Treatment time | 12 min | 15 min | 10 min |
| Treatment temperature | 50° C. | 50° C. | 50° C. |
| Rotational speed | 1500 rpm | 1500 rpm | 1500 rpm |
| Resist film thickness (before treatment) | 7000 Å | 7000 Å | 7000 Å |
| Resist film thickness (after treatment) | Stripped completely | Stripped completely | Stripped completely |

Oxidative Decomposition Treatment with Ozone Water after Resist Stripping

After the stripping of the resist, each substrate was observed under a microscope equipped with a laser beam source. No resist film was observed to be remaining on the surface of the substrate, but some resist pieces and relatively large, fine particles were observed to be remaining there. Those fine particles were composed of carbon or silicon oxide as a primary component. The fine particles remaining on the substrate shortly after the stripping of the resist had a particle size distribution which had a peak at about 3 $\mu$m. As those fine particles are readily oxidized and decomposed with ozone water having oxidizing power, oxidative decomposition of the fine particles with ozone water was conducted. The oxidative decomposition was conducted by ejecting ozone water from the nozzle unit illustrated in FIGS. 2A–2C. The counting of fine particles before and after the treatment was conducted by a laser beam scattering particle counter. Treatment conditions for the individual samples and the results of the treatment are presented in Table 4. Ozone water was ejected from the nozzle unit shown in FIGS. 2A–2C at 10 mL/min per cm$^2$ of substrate area.

TABLE 4

Conditions for Oxidative Decomposition of Resist Pieces with Ozone Water (60 ppm), and Results of Treatment

| Sample | A | B | C |
|---|---|---|---|
| Treatment solution | Ozone water | Ozone water | Ozone water |
| Ozone concentration | 60 ppm | 60 ppm | 60 ppm |
| Treatment time | 30 sec | 30 sec | 30 sec |
| Treatment temperature | 25° C. | 25° C. | 25° C. |
| Rotational speed | 1500 rpm | 1500 rpm | 1500 rpm |
| Number of fine particles (before treatment) | 2560 particles >0.2 $\mu$m | 3200 particles >0.2 $\mu$m | 1220 particles >0.2 $\mu$m |
| Number of fine particles (after treatment) | 3201 particles* >0.2 $\mu$m | 3600 particles >0.2 $\mu$m | 1802 particles* >0.2 $\mu$m |

*The number of fine particles on each sample increased after the treatment. This means that fine particles substantially greater than 0.2 $\mu$m were divided into smaller fine particles by the treatment.

Cleaning Treatment with Hydrogen Water after Oxidative Decomposition with Ozone Water From the nozzle unit shown in FIGS. 2A–2C and provided with the ultrasonic generators, hydrogen water was ejected to treat each sample. The frequency of ultrasonic waves at that time was 1.5 MHz. The counting of fine particles before and after the treatment was conducted by a laser beam scattering particle counter. According to an observation under the microscope before the treatment, practically no resist pieces were found, and only very fine particles were found to be remaining. Further, the particle size distribution of fine particles had shifted form 3 $\mu$m to about 1 $\mu$m, thereby indicating that the relatively large fine particles remaining after the resist stripping had been oxidatively decomposed. The ORP value of the hydrogen water was about −550 mV and, as the fine particles and the surface potential of the substrate were both charged negative, the fine particles were removed by isostatic repulsion. Owing to cavitation effect of ultrasonic waves, the fine particles were also removed physically and moreover, radicals such as hydrogen radicals and hydroxyl radicals were produced. Subsequent to that treatment step, spin dry was conducted at 3000 rpm in a nitrogen gas stream. The samples treated as described above were all cleaned well.

TABLE 5

Conditions for Removal of Resist Pieces with Hydrogen Water, and Results of Treatment

| Sample | A | B | C |
|---|---|---|---|
| Treatment solution | Hydrogen water | Hydrogen water | Hydrogen water |
| Hydrogen concentration | 1.5 ppm | 1.5 ppm | 1.5 ppm |
| Treatment time | 30 sec | 30 sec | 30 sec |
| Treatment temperature | 25° C. | 25° C. | 25° C. |
| Rotational speed | 1500 rpm | 1500 rpm | 1500 rpm |
| Number of fine particles (before treatment) | 3201 particles >0.2 $\mu$m | 3600 particles >0.2 $\mu$m | 1802 particles >0.2 $\mu$m |
| Number of fine particles (after treatment) | 7 particles >0.2 $\mu$m | 10 particles >0.2 $\mu$m | 9 particles >0.2 $\mu$m |

EXAMPLE 2

Resist Stripping Treatment by SPM Treatment

SPM treatment for the treatment of each sample was conducted in a conventional chemical bath cleaning equipment. Treatment conditions for that treatment step are presented in Table 6. The thickness values of each resist film before and after the treatment are also shown.

TABLE 6

Conditions for Resist Stripping by SPM, and Results of Stripping

| Sample | A | B | C |
|---|---|---|---|
| Treatment solution | SPM | SPM | SPM |
| Mixing ratio (volume ratio) (sulfuric acid: hydrogen peroxide) | 4:1 | 4:1 | 4:1 |
| Treatment time | 7 min | 7 min | 5 min |
| Treatment temperature | 100° C. | 100° C. | 100° C. |
| Resist film thickness (before treatment) | 7000 Å | 7000 Å | 7000 Å |
| Resist film thickness (after treatment) | Stripped completely | Stripped completely | Stripped completely |

After the stripping of the resist, each substrate was observed under the microscope equipped with the laser beam source. No resist film was observed to be remaining on the surface of the substrate. Fine particles remaining on the substrate shortly after the stripping of the resist had a particle size distribution having a peak at about 1 µm. Oxidative decomposition with ozone water, as the next step, was then conducted.

Oxidative Decomposition Treatment with Ozone Water after Resist Stripping

After the stripping of the resist, each substrate was observed under the microscope equipped with the laser beam source. No resist film was observed to be remaining on the surface of the substrate, but some resist pieces and relatively large, fine particles were observed to be remaining there. Those fine particles were composed of carbon or silicon oxide as a primary component. The fine particles remaining on the substrate shortly after the stripping of the resist had a particle size distribution which had a peak at about 0.5 µm. As those fine particles are readily oxidized and decomposed with ozone water having oxidizing power, oxidative decomposition with ozone water was conducted. The oxidative decomposition was conducted by ejecting ozone water from the nozzle unit illustrated in FIGS. 2A–2C. The counting of fine particles before and after the treatment was conducted by the laser beam scattering particle counter. Treatment conditions for the individual samples and the results of the treatment are presented in Table 7. Ozone water was ejected from the nozzle unit shown in FIGS. 2A–2C at 10 mL/min per cm² of substrate area.

TABLE 7

Conditions for Oxidative Decomposition of Resist Pieces with Ozone Water (60 ppm), and Results of Treatment

| Sample | A | B | C |
|---|---|---|---|
| Treatment solution | Ozone water | Ozone water | Ozone water |
| Ozone concentration | 60 ppm | 60 ppm | 60 ppm |
| Treatment time | 30 sec | 30 sec | 30 sec |
| Treatment temperature | 25° C. | 25° C. | 25° C. |
| Rotational speed | 1500 rpm | 1500 rpm | 1500 rpm |
| Number of fine particles >0.2 µm (before treatment) | 2255 particles | 4856 particles | 1280 particles |
| Number of fine particles >0.2 µm (after treatment) | 3160 particles* | 5221 particles* | 2120 particles* |

*The number of fine particles on each sample increased after the treatment. This means that fine particles substantially greater than 0.2 µm were divided into smaller fine particles by the treatment.

Cleaning Treatment with Hydrogen Water after Oxidative Decomposition with Ozone Water From the nozzle unit shown in FIGS. 2A–2C and provided with the ultrasonic generators, hydrogen water was ejected to treat each sample. The frequency of ultrasonic waves at that time was 1.5 MHz. Treatment conditions for the respective samples and results thereof and the results of the treatment are shown in FIG. 8. The counting of fine particles before and after the treatment was conducted by the laser beam scattering particle counter. According to an observation under the microscope before the treatment, only fine particles were found to be remaining. Subsequent to that treatment step, spin dry was conducted at 3000 rpm in a nitrogen gas stream. The samples treated as described above were all cleaned well. This Example has demonstrated to bring about results comparable with the conventional treatment, thereby indicating that the treatment according to the present invention can substitute for the conventional treatment.

TABLE 8

Conditions for Removal of Resist Pieces with Hydrogen Water, and Results of Treatment

| Sample | A | B | C |
|---|---|---|---|
| Treatment solution | Hydrogen water | Hydrogen water | Hydrogen water |
| Hydrogen concentration | 1.5 ppm | 1.5 ppm | 1.5 ppm |
| Treatment time | 30 sec | 30 sec | 30 sec |
| Treatment temperature | 25° C. | 25° C. | 25° C. |
| Rotational speed | 1000 rpm | 1000 rpm | 1000 rpm |
| Number of fine particles >0.2 µm (before treatment) | 3160 particles | 5221 particles | 2120 particles |
| Number of fine particles >0.2 µm (after treatment) | 8 particles | 10 particles | 6 particles |

EXAMPLE 3

Resist Stripping Treatment by SPM Treatment

SPM treatment for the treatment of each sample was conducted in the conventional chemical bath cleaning equipment. Treatment conditions for that treatment step are presented in Table 9. The thickness values of the resist film before and after the treatment are also shown.

TABLE 9

Conditions for Resist Stripping by SPM, and Results of Stripping

| Sample | A | B | C |
|---|---|---|---|
| Treatment solution | SPM | SPM | SPM |
| Mixing ratio (volume ratio) (sulfuric acid: hydrogen peroxide) | 4:1 | 4:1 | 4:1 |
| Treatment time | 10 min | 13 min | 13 min |
| Treatment temperature | 100° C. | 125° C. | 125° C. |
| Resist film thickness (before treatment) | 7000 Å | 7000 Å | 7000 Å |
| Resist film thickness (after treatment) | Stripped completely | Stripped completely | Stripped completely |

After the stripping of the resist, the substrates were observed under the microscope equipped with the laser beam source. Practically no fine particles were observed on the surface of each substrate, but some of the samples were observed to carry a great number of fine particles adhered thereon. This appears to be a problem attributable to deterioration of the SPM treatment solution. After the stripping, each treated substrate was soaked for 5 minutes in ultrapure water to rinse off the SPM treatment solution, and was then dried by spin drying.

Cleaning Treatment with Hydrogen Water Added with Ozone Water (Ozone-Hydrogen Water) after Resist Stripping After the above-described SPM treatment, each substrate was treated by using ozone-hydrogen water which had been prepared by adding ozone water to hydrogen water (1.5 ppm). The concentration of the added ozone water was 60 ppm. The concentration of ozone in the ozone water should be chosen depending on the level of contamination by fine particles to be removed. In view of the fact that the contaminants primarily comprised organic ones and the level of contamination was high, the ozone concentration was set as described above. To treat each sample, the ozone-hydrogen water was ejected at 3 mL/min per $cm^2$ of substrate area from the nozzle unit shown in FIGS. 2A–2C and equipped with the ultrasonic generators. The frequency of ultrasonic waves in the cleaning treatment was 1.5 MHz. Treatment conditions for the individual samples and the results of the treatment are presented in Table 10.

The counting of fine particles before and after the treatment was conducted by the laser beam scattering particle counter. According to an observation under the microscope before the treatment, practically no resist pieces were found, and only very fine particles were found to be remaining. Further, the particle size distribution of fine particles had shifted form 3 μm to about 1 μm, thereby indicating that the relatively large fine particles remaining after the resist stripping had been oxidatively decomposed. The ORP value of the hydrogen water alone was about –550 mV and, as the particles and the surface potential of the substrate were both charged negative, the oxidized particles were removed by isostatic repulsion. Owing to cavitation effect of ultrasonic waves, the fine particles were also removed physically and moreover, radicals such as hydrogen radicals and hydroxyl radicals were produced. Subsequent to that treatment step, spin dry was conducted at 3000 rpm in a nitrogen gas stream. The samples treated as described above were all cleaned well.

From the above results, treatment with ozone water and hydrogen water or with ozone-hydrogen water has been found to be effective especially for the removal of fine particles after resist stripping. Incidentally, this Example was conducted in the single-wafer equipment. When it is intended to remove only such fine particles without needing removal of a large amount of organic matter such as resist, substantially the same effect can be obtained even when soaked treatment is conducted using hydrogen water, ozone water or ozone-hydrogen water. From the viewpoint of removal of fine particles, the present invention is therefore useful irrespective of the type of the equipment.

EXAMPLE 4

Resist Stripping by SMC Treatment

By the procedures described above as Example 4 in Table 2, Samples D and E shown in Table 1 were each successively treated. Using the equipment illustrated in FIG. 3, each of Samples D and E was firstly heated for about 60 seconds prior to its treatment with ozone gas. Sample D was heated to 350° C., at which an ozone-containing oxygen gas having an ozone concentration of 5 vol. % was caused to flow at a flow rate of 14 L/min for 180 seconds to treat the sample. Sample E was heated to 350° C., at which an ozone-containing oxygen gas having an ozone concentration of 5 vol. % was caused to flow at a flow rate of 16 L/min for 200 seconds to treat the sample. The resist thickness of each sample was measured by the interference film-thickness measuring instrument. After treatment with ozone gas, the number of fine particles on each sample was not counted because resist pieces were remaining at a central part of the sample substrate.

Next, each sample which had been subjected to ashing by the ozone gas treatment was cleaned with ozone water in the same manner as in Example 1 by using the apparatus illustrated in FIG. 1. While rotating each sample at 1000 rpm, ozone water was ejected from the nozzle unit for 90 seconds (Sample D) or 120 seconds (Sample E) to treat the sample. The number of fine particles greater than 0.2 μm was counted by the laser beam scattering particle counter both before and after the treatment. Most of the fine particles were confirmed to consist of fine carbon particles and fine silicon particles.

TABLE 10

Conditions for Removal of Resist Pieces with Ozone-Hydrogen Water, and Results of Treatment

| Sample | A | B | C |
| --- | --- | --- | --- |
| Treament solution | Ozone-hydrogen water | Ozone-hydrogen water | Ozone-hydrogen water |
| Hydrogen concentration | 1.5 ppm | 1.5 ppm | 1.5 ppm |
| Ozone concentration | 60 ppm | 60 ppm | 60 ppm |
| Ozone water: hydrogen water mixing ratio (by volume) | 1:8 | 1:8 | 1:8 |
| Treatment time | 30 sec | 30 sec | 20 sec |
| Treatment temperature | 25° C. | 25° C. | 25° C. |
| Rotational speed | 1500 rpm | 1500 rpm | 1500 rpm |
| Number of fine particles >0.2 μm (before treatment) | 102 particles >0.2 μm | 89 particles >0.2 μm | 251 particles >0.2 μm |
| Number of fine particles >0.2 μm (after treatment) | 15 particles >0.2 μm | 21 particles >0.2 μm | 29 particles >0.2 μm |

To remove fine particles still remaining on each sample subsequent to its treatment with ozone water, the sample was next treated with hydrogen water by using the apparatus illustrated in FIG. 1. While rotating each of Samples D and E at 1000 rpm, hydrogen water was ejected from the nozzle unit 3 equipped with the ultrasonic wave generators to treat the sample for 20 seconds. The frequency of ultrasonic waves in the cleaning treatment was 1.5 MHz. The number of fine particles was counted likewise by the laser beam scattering particle counter both before and after the treatment. The results of those treatment are shown in Table 11.

TABLE 11

Results of Sample Treatment

| Treatment | Items measured items both before and after treatment | Sample D | Sample E |
|---|---|---|---|
| Ozone gas treatment | Film thickness (before treatment) | 12537 Å | 12449 Å |
|  | Film thickness (after treatment) | 3252 Å | 2801 Å |
| Ozone water treatment | Number of fine particles (before treatment) | Resist remained | Resist remained |
|  | Number of fine particles (after treatment) | 2041 particles | 1653 particles |
| Hydrogen water treatment | Number of fine particles (before treatment) | 2041 particles | 1653 particles |
|  | Number of fine particles (after treatment) | 18 particles | 14 particles |

It is evident from these results that the substrate treatment in this Example permits not only removal of organic substances but also stripping of resist as high-concentration ozone water of about 60 ppm ozone concentration is used for ozone water treatment. Accordingly, this Example is effective especially when it is desired to avoid ashing with ozone gas as much as possible, and makes it possible, for example, to apply treatment with ozone water and hydrogen water as an equivalent to the conventional post-oxidative-decomposition SPM treatment by stopping the dry treatment with ozone gas at a certain level depending upon the conditions for ion implantation to a resist film. It has also been found possible to stop the ashing of a resist at a certain level in ozone gas treatment and to remove the resist and organic substances at the same time in the subsequent ozone water treatment. It is clear that the number of fine particles remaining after the treatment of Example 4 can be decreased to a level comparable with or smaller than the conventional process.

COMPARATIVE EXAMPLE 1

Stripping Treatment of Resist by SPM

Conditions for resist stripping by SPM are shown in Table 12. Thickness values of each resist film both before and after the treatment are also shown. The treatment was conducted in the chemical solution soaking equipment. The resist was completely stripped off.

TABLE 12

Conditions for Resist Stripping by SPM, and Results of Stripping

| Sample | A | B | C |
|---|---|---|---|
| Treatment solution | SPM | SPM | SPM |
| Mixing ratio (volume ratio) sulfuric acid: hydrogen peroxide) | 4:1 | 4:1 | 4:1 |
| Treatment time | 10 min | 13 min | 13 min |
| Treatment temperature | 100° C. | 125° C. | 125° C. |
| Resist film thickness (before treatment) | 12200 Å | 12400 Å | 12500 Å |
| Resist film thickness (after treatment) | Stripped completely | Stripped completely | Stripped completely |

The substrates were observed under the microscope. Relatively large, fine particles were not observed practically, but some of the samples were observed to carry a great number of fine particles adhered thereon. This appears to be a problem attributable to deterioration of the SPM treatment solution. After the cleaning treatment, each treated substrate was soaked for 5 minutes in ultrapure water to rinse off the SPM treatment solution, and was then dried by spin drying. Thereafter, cleaning treatment by APM was conducted.

Cleaning Treatment by APM after Stripping Treatment of Resist by SPM

Each sample was soaked and treated in a chemical solution soaking equipment equipped with ultrasonic wave generators in a lower part of a cleaning bath. The frequency of ultrasonic waves in the cleaning treatment was 1.5 MHz. The number of fine particles was counted by the laser beam scattering particle counter both before and after the treatment. Conditions for the treatment and the results of the treatment are shown in Table 13. The remaining fine particles were substantially removed.

TABLE 13

Conditions for Removal of Resist Pieces by APM, and Results of Treatment

| Sample | A | B | C |
|---|---|---|---|
| Treatment solution | APM | APM | APM |
| Mixing ratio (by volume ratio) (aqueous ammonia:hydrogen peroxide:ultrapure water) | 1:1:8 | 1:1:8 | 1:1:8 |
| Treatment time | 5 min | 5 min | 5 min |
| Treatment temperature | 65° C. | 65° C. | 65° C. |
| Number of fine particles (before treatment) | 45 particles >0.2 μm | 51 particles >0.2 μm | 55 particles >0.2 μm |
| Number of fine particles (after treatment) | 8 particles >0.2 μm | 10 particles >0.2 μm | 9 particles >0.2 μm |

This Example gave results comparable with those of the conventional treatment in the Comparative Example. This is a corroboration for the fact that the treatment of this invention can substitute for the conventional treatment. The present invention has hence been proven to solve the above-described problems and to be particularly useful.

What is claimed is:

1. A substrate treatment process for removing organic matter existing on a substrate, comprising treating said substrate with ozone water prepared by dissolving an ozone-containing gas in ultrapure water and hydrogen water prepared by dissolving a hydrogen-containing gas in ultrapure water in tandem, wherein said ozone water includes at least one substance added in the amount, sufficient to maintain ozone concentration in said ozone water, wherein the said substance is selected from the group consisting of carbon dioxide and ammonium carbonate.

2. A substrate treatment process according to claim 1, wherein said substrate to be treated is one of a glass substrate and a substrate comprising one of silicon crystal and metal compound crystal.

3. A substrate treatment process according to claim 1, wherein said substrate to be treated is a substrate contaminated with organic matter or ion-implanted organic matter.

4. A substrate treatment process according to claim 1, wherein said substrate to be treated is a substrate contaminated with organic matter adhered in a semiconductor element fabrication process.

5. A substrate treatment process according to claim 1, wherein said ozone concentration is not lower than 10 ppm.

6. A substrate treatment process according to claim 1, wherein said hydrogen water has a hydrogen concentration not lower than 0.5 ppm.

7. A substrate treatment process according to claim 1, wherein said ozone water is applied to said substrate under treatment at a rate not lower than 1 mL/min per square centimeter of substrate area.

8. A substrate treatment process according to claim 1, wherein said hydrogen water is applied to said substrate under treatment after activating said hydrogen water by ultrasonic treatment.

9. A substrate treatment process according to claim 1, wherein said substrate is treated under rotation in a horizontal plane.

10. A substrate treatment process according to claim 9, wherein said substrate is rotated at a rotational speed not lower than 500 rpm.

11. A substrate treatment process according to claim 1, wherein said substrate is treated in the same treatment apparatus.

12. A substrate treatment process according to claim 1, wherein said substrate is treated while being heated at a temperature not lower than 30° C.

13. A substrate treatment process according to claim 12, wherein said heating is performed while introducing heated ultrapure water or heated nitrogen.

14. A substrate treatment process according to claim 1, wherein said organic matter is subjected to ashing with an oxidizing gas before the step in which the substrate is treated with one of said ozone water and said hydrogen water.

15. A substrate treatment process according to claim 14, wherein said oxidizing gas is an ozone-containing gas; and said substrate is subjected to ashing at least once in a dry atmosphere while being heated at a temperature not lower than room temperature.

16. A substrate treatment process according to claim 15, wherein said substrate under ashing is heated at 300 to 350° C.

17. A substrate treatment process according to claim 16, wherein said ozone-containing gas has an ozone concentration not lower than 4 vol. %.

18. A substrate treatment process according to claim 1, wherein said substrate is cleaned with an organic solvent before the step in which the substrate is treated with one of said ozone water and said hydrogen water.

19. A substrate treatment process according to claim 1, wherein said substrate is treated with HF-containing water after the step in which the substrate is treated with one of said ozone water and said hydrogen water.

* * * * *